United States Patent [19]

Bacrania et al.

[11] Patent Number: 5,140,326
[45] Date of Patent: Aug. 18, 1992

[54] CONVERTER COMPARATOR CELL WITH IMPROVED RESOLUTION

[75] Inventors: Kantilal Bacrania, Palm Bay; Gregory J. Fisher, Indialantic, both of Fla.; Shen Tu, Fogelsville, Pa.

[73] Assignee: Harris Corporation, Melbourne, Fla.

[21] Appl. No.: 647,346

[22] Filed: Jan. 29, 1991

[51] Int. Cl.$^5$ .................. H03M 1/36; H03M 1/34
[52] U.S. Cl. .................................. 341/159; 341/158
[58] Field of Search .................. 341/159, 158, 155; 307/355, 356, 530, 362

[56] References Cited

U.S. PATENT DOCUMENTS

| | | | |
|---|---|---|---|
| 4,028,558 | 6/1977 | Heller et al. | 307/355 |
| 4,338,592 | 7/1982 | Wilensky. | |
| 4,449,118 | 5/1984 | Dingwall et al. | 341/159 X |
| 4,461,965 | 7/1984 | Chin | 307/355 X |
| 4,691,189 | 9/1987 | Dingwall et al. | |
| 4,695,748 | 9/1987 | Kumamoto | 307/355 |
| 4,745,393 | 5/1988 | Tsukada et al. | 341/159 |
| 4,854,383 | 7/1989 | Iida | 307/355 |

OTHER PUBLICATIONS

A/D Converters Background Information; ILC-DDC Product Catalog (1981).
ICAN-6956 CMOS/SOS Flush A/D Converter, the CA3300, Operates at Video Speed on Low Power; GE Solid State Flyer.
Data Acquisition & Conversion Handbook; H. Schmid 1970.
Monolithic Expandable 6 Bit 20 MHz CMOS/SOS A/D Converter; by Dingwall-IEEE J. Solid-State Circuits, vol. SC-14 (Dec. 79).

*Primary Examiner*—Sharon D. Logan
*Attorney, Agent, or Firm*—Barnes & Thornburg

[57] ABSTRACT

A comparator having a differential sense amplifier connected to the output of an input comparator, and the decoding logic connected between the sense amplifier and the output latch. The comparator is designed for a flash A/D converter having a reference signal generator for one or more of the sense amplifiers.

28 Claims, 3 Drawing Sheets

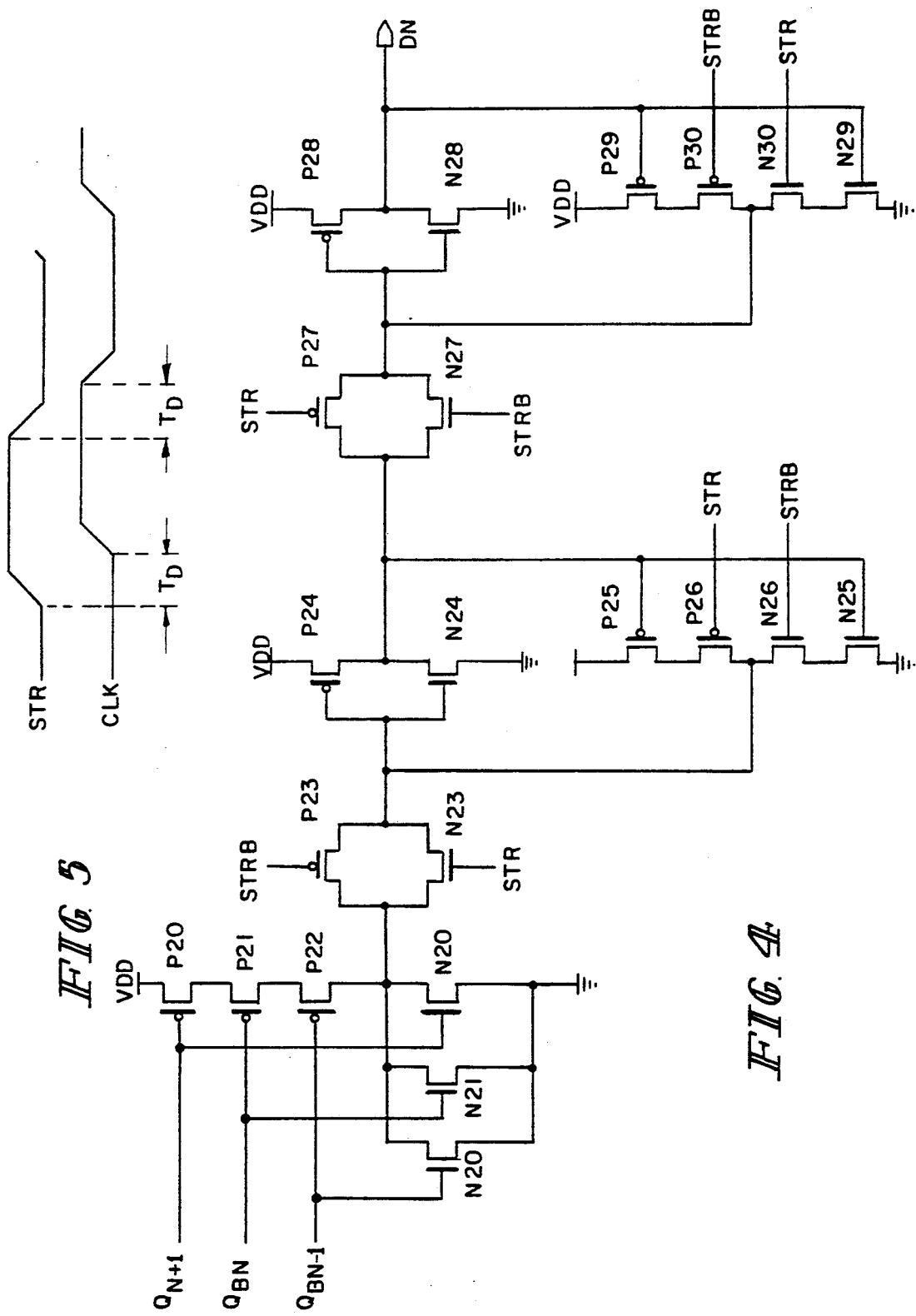

CONVERTER COMPARATOR CELL WITH IMPROVED RESOLUTION

BACKGROUND AND SUMMARY OF THE INVENTION

The present invention relates to analog-to-digital converters and more specifically to an improved comparator circuit for use in analog-to-digital converters.

The comparator circuit of an analog-to-digital converter includes an input signal compared against a reference signal and subsequently digitized. One form of analog-to-digital conversion includes a flash quantization. As illustrated in FIG. 1, a parallel string of comparators is used to compare the analog input voltage directly to voltage steps on a resistive ladder. The results of the comparison are provided to a latch which indicates whether the output of the comparator is high or low. These results are then decoded by a tap detection logic or decoder and provided as digital output signals. A typical single latch configuration of the prior art is illustrated in FIG. 1.

A flash converter is rapid because the signal is propagated in parallel connected comparators and decoding logic. As a tradeoff, the flash converter is more complex requiring a greater number of comparators, a decoding logic dependent upon the number of bits and an input resistor string.

As discussed in U.S. Pat. No. 4,691,189 to Dingwall, et al, single latch circuits may provide erroneous results. The Dingwall, et al patent suggests using a D type master-slave flip-flop (DMSFF) following a two stage autozero comparator. The use of DMSFF gives poor resolution since the threshold of the first D latch stage varies with the processing temperature and supply voltage. The same clock that is used in the autozero comparator is used in the DMSFF latches.

Thus it is an object of the present invention to provide a flash converter with improved accuracy and resolution.

Another object of the present invention is to provide a flash converter whose resolution is independent of processing and temperature induced changes.

These and other objects are achieved by providing a comparator circuit wherein the circuit includes a comparator for comparing the input signal to the reference signal, a sense amplifier connected to the output of the comparator for sensing and providing an amplified signal and an output circuitry connecting the output of the sensed amplifier for receiving and latching the amplified signal. The comparator would include a two-stage autozero comparator. The sense amplifier includes a differential amplifier having a first input connected to the output of the comparator and a second input connected to a second reference signal. A reference signal generator would produce the second reference signal. The output stage of the reference signal generator would match the output stage of the comparator. Thus the sense amplifier will not be affected by processing or temperature variations since the reference signal generated will track the output of the comparator stage. The sense amplifier would include input and output buffer circuits. The sense amplifier minimizes loading on the autozero comparator stage and achieves the speed of a D-type latch while providing greater accuracy and resolution since true differential amplification is taking place.

The output stage of the comparator would include a decoder having its input connected to the output of the sense amplifier and a latch connected to the output of the decoder. By providing the decoding after the sense amplifier and before the latch circuitry, the delay of the latch circuitry occurs after the decoding. The latch circuitry preferably is a DMSFF so as to provide a valid output for the entire clock period instead of the validity for only half the clock period as would be true if using a single D-latch. A clock signal is used to control the comparator circuits while a strobe signal is used to control the sense amplifier and latches. This provides independent control of the input sampling and holding as well as the subsequent signal processing. The strobe signal leads the clock signal with respect to phase.

When a plurality of the comparator circuits is used in a flash analog-to-digital converter, a common second reference signal generator may be used for one or more of the comparators. Thus for example, each row column may include its own reference signal generator.

Other objects, advantages and novel features of the present invention will become apparent from the following detailed description of the invention when considered in conjunction with the accompanying drawings.

BRIEF DESCRIPTION OF THE DRAWINGS

FIG. 4 is a schematic of the decoding logic and latch circuit according to the principles of the present invention;

FIG. 5 is a timing diagram according to the principles of the present invention.

DETAILED DESCRIPTION OF THE DRAWINGS

Figure 1:
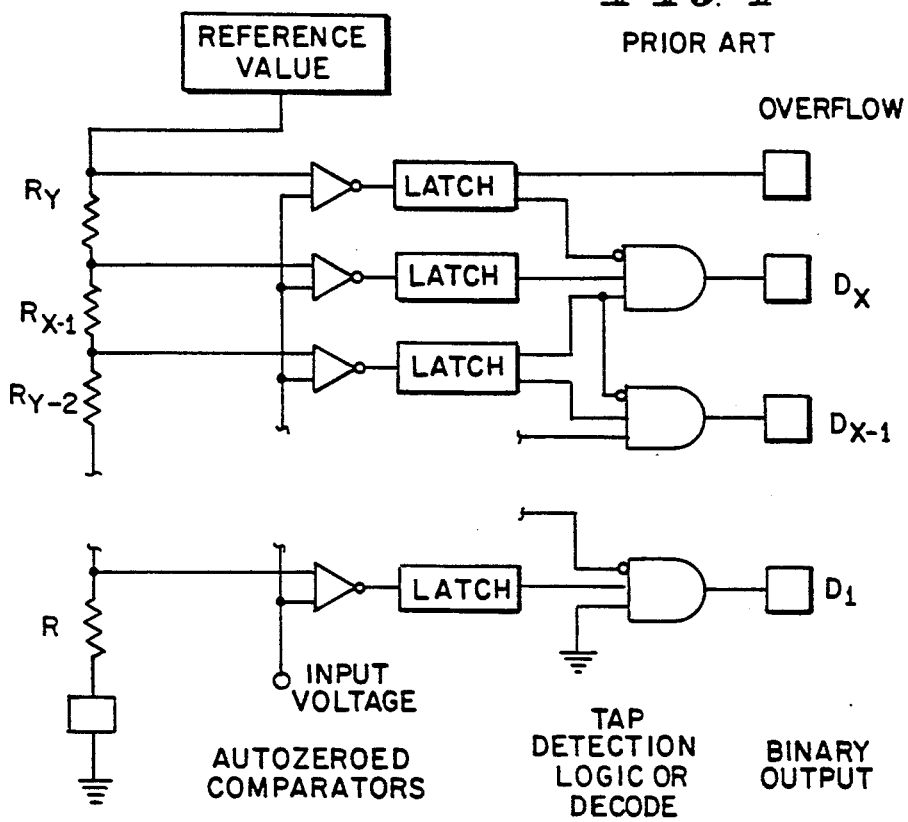
FIG. 1 is a block diagram of a flash analog to-digital converter of the prior art.
Figure 2:
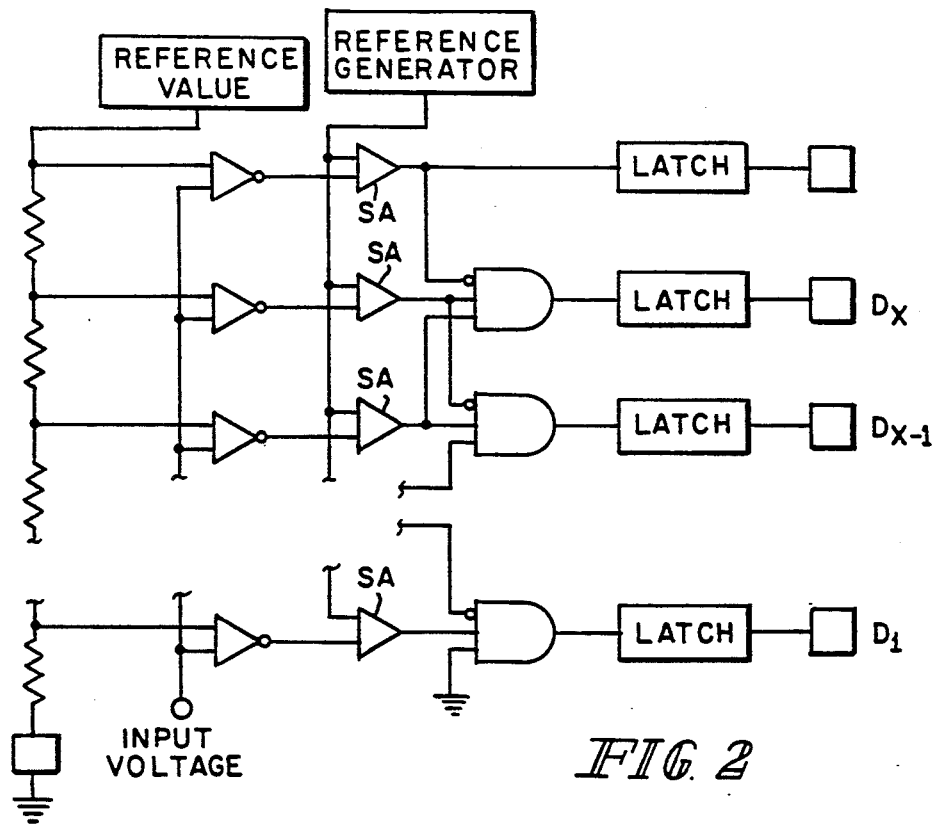
FIG. 2 is a schematic of a flash analog-to-digital converter according to the principles of the present invention.

As illustrated in FIG. 2, the input signal is provided to a plurality of parallel comparators wherein they are compared to voltage steps on a resistive ladder. As in the prior art of FIG. 1, preferably the comparators are autozero comparators. The output of the comparators are provided respectively to a first input of a plurality of parallel sense amplifiers. A second input of the sense amplifier is from a reference generator. The reference generator may be the same for all the comparators or one or more reference generators may be connected to a group of sense amplifiers. As will be discussed with respect to FIG. 3, the output stage of the reference generator is identical to the output stage of the last autozero stage of the comparator circuit. This increases the resolution of the comparator since true differential amplification is produced by the sense amplifier. Also as will be discussed with respect to FIG. 3, the sense amplifier includes a source following stage to minimize loading on the autozero comparators.

The output of the sense amplifier is connected directly to the tap detection or decoding logic. The decoded output is then provided to the latches. This is a reversal of the signal processing of the output signals from that of FIG. 1 of the prior art. As in the Dingwall U.S. Pat. No. 4,691,189 the output latch is preferably a D-type master-slave flip-flop (DMSFF). By providing the decoding logic of adjacent cells after the sense amplifier and before the DMSFF, one stage of delay is removed from the decoding process. Also, by selecting the output latch to be a DMSFF, a valid output for the entire clock period is provided instead of the validity for only half of a clock period as in D-type latches. This is necessary to achieve high clock rates.

Figure 3:
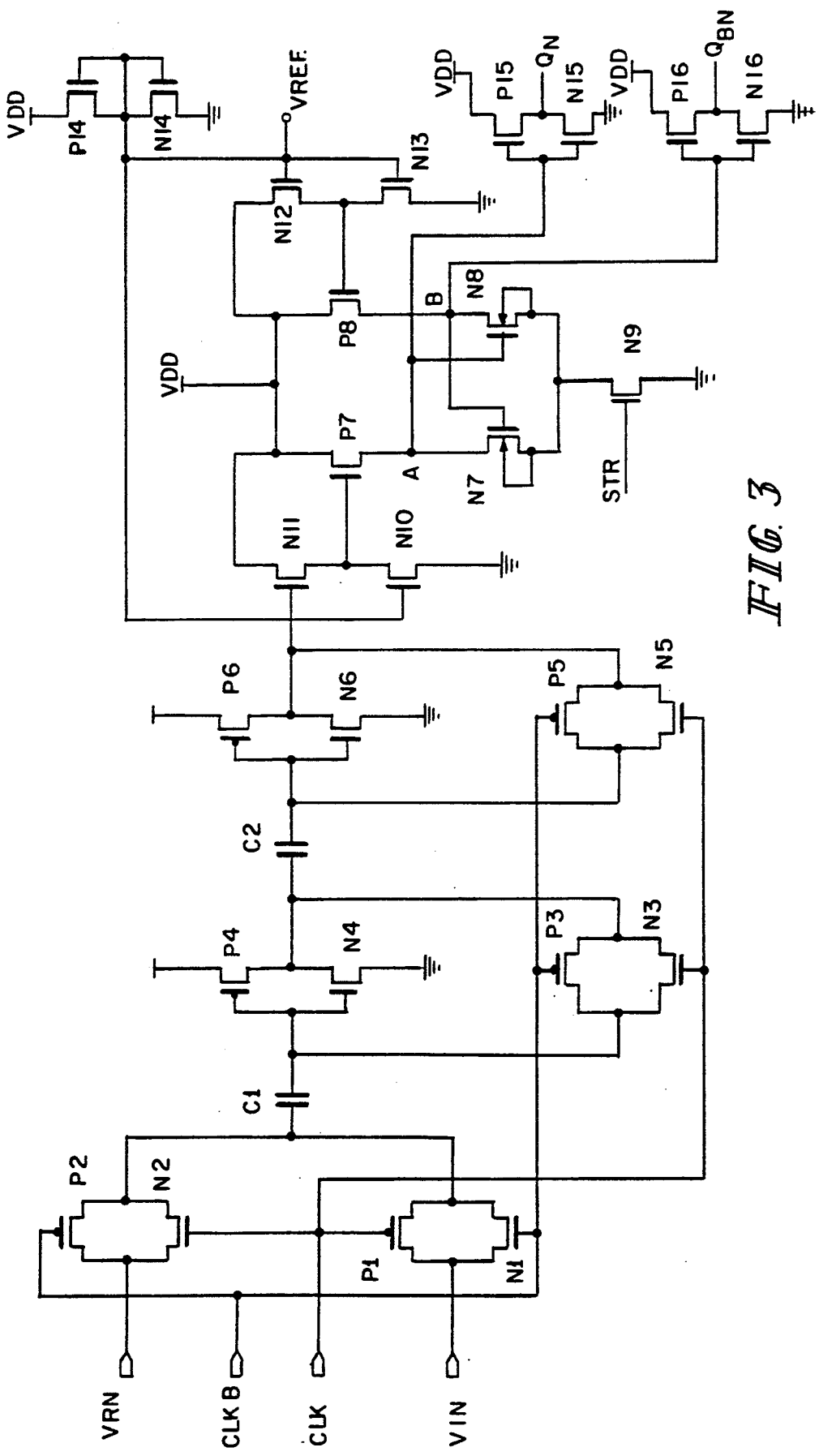
FIG. 3 is a detailed schematic of a comparator according to the principles of the present invention.

As illustrated in FIG. 3, the comparator includes an input stage having transmission switches P1, N1 and P2, N2 providing the input signal VIN and the reference signal VRN for the particular stage to a first capacitor C1. A clock signal CLK is connected to P1 and N2 and the inverse clock signal CLKB is connected to N1 and P2. Thus the transmission switches P1, N1 and P2, N2 are out of phase. The resulting difference signal on capacitor C1 is provided to an inverter P4, N4 having a transmission gate P3, N3 which provide the autozeroing capability. The output of the first inverter P4, N4 is provided to a second capacitor C2 which is connected to the input of a second inverter P6, N6. A transmission switch P5, N5 connects the input and output of the inverter P6, N6 and also provides autozeroing. The transistors P3, N3 and P5, N5 of the transmission gates are driven by CLK and CLKB signals such that they are both on during the same phase of the clock's signal. The operation of the autozero comparators is well known and is described in the U.S. Pat. No. 4,691,189.

The output of the autozero comparator stage is provided to a sense amplifier illustrated in FIG. 3. The sense amplifier includes parallel connected amplifier transistors P7 and P8 having regenerative active loads N7 and N8 in series therewith. Enable switch N9 having its gate controlled by the strobe signal STR activates the sense amplifier P7, P8, N7, N8. Sense amplifier transistor P7 is connected to the output stage P6, N6 of the comparators by a buffer including series connected transistors N10, N11. The gate of N11 is connected to the output of the last stage P6, N6 of the comparator. The gate of transistor of N10 of the input buffer is connected to a reference value VREF produced by reference generator P14, N14. The reference signal VREF is also connected to the transistor P8 through an input buffer N12, N13.

The transistors P14 and N14 are matched to P6 and N6 such that the reference signal provided to P8 is matched for processing variation and temperature to the output stage P6, N6 of the comparator. Thus the reference voltage is matched to the autozero comparator output voltage regardless of temperature and processing variations. The reference generator P14, N14 provides a reference signal which is proportional to the geometrical relationship of P14 to N14. This reference value through input buffers N12 and N13 maintains P8 at the desired switching point. Since the reference voltage is also applied to N10, input to P7 is a function of the output signal of the comparators and to gate of N11. By matching transistors N10, N11, N12 and N13, the inputs are completely balanced to the differential sense amplifiers P7 and P8. This allows accurate switching of the differential sense amplifier P7, P8. The output of the sense amplifier is from the drains of P7 and P8 through output buffer P15, N15 as QN and P16, N16 as QBN.

When the strobe signal STR is low, N9 is off. This allows A and B to charge up to the positive power supply VDD. As the strobe signal STR goes high, the differential signal is applied by P7 and P8 into the regenerative active loads N7 and N8. The voltages of nodes A and B will then charge to the appropriate and complementary output values which are buffered and inverted by the buffers P15, N15 and P16, N16.

As illustrated in FIG. 5, the strobe signal STR leads in phase the clock signal CLK by a delay TD. Thus the strobe signal STR rises before the clock signal CLK to ensure sensing of a valid comparator output. The time delay TD must be non-zero. This allows all the switches in the autozero comparators to be clocked with a single clock signal, either CLK or its complement CLKB. Thus delayed and non-overlapping clock signals are avoided in the autozero comparator stages. This allows shorter clock periods and faster clock rates.

The output QN and QBN of each comparator and strobed sense amplifier stage are provided to a three-input NOR gate for decoding as illustrated in FIG. 4. The three-input NOR gate includes transistors P20, P21, P22 and N20, N21, N22. The inputs for three adjacent stages include QBN−1, QBN and QN+1.

The output of the NOR gate is provided to a D-type master-slave flip flop (DMSFF). The first stage of the master-slave flip-flop includes a transmission gate P23, N23 connected to an inverter P24, N24. The output of inverter P24, N24 is latched by a feedback including feedback inverter P25, N25 and transmission switch P26, N26. The output of the latch P24, N24 is provided to transmission switch P27, N27 to the second latch P28, N28. A feedback inverter P29, N29 and transmission switch P30, N30 latch the inverter P28, N28. The output of a latch stage N28, P28 is the digital data signal DN.

The transmission switches of the DMSFF are controlled by the strobe STR and the complementary strobe signal STRB. The transmission switches of the first stage are out of phase with the transmission switches of the second stage. The timing interrelationship of the operation of the two stages is described in U.S. Pat. 4,691,189.

As with the sense amplifier, by using the strobe signal instead of the clock signal, the switches of the autozero comparator can be clocked with a single signal and delay and non-overlapping signals are avoided. This allows shorter clock periods and faster clock rates. By providing the adjacent cell decoding logic after the sense amplifier and before the DMSFF, one level of switching delays before decoding is eliminated. Also the use of a DMSFF allow a valid output for an entire clock period instead of a valid output for only half the clock period as would be the case with a single D-latch. This also allows the use of higher clock rates.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A comparator comprising:
    comparator means, having first and second signal inputs and an output, for comparing signals at said first and second inputs and providing a signal at said output of said comparator means as function of said comparison;
    sense amplifier means including a differential sense amplifier, having a first input connected to said output of said comparator means and a second input connected to a reference signal and an output, for sensing signals at said first input and providing an amplified signal at said output of said sense amplifier; and output means, having an input connected to said output of said sense amplifier and an output, for receiving and latching said amplified signal.

2. A comparator according to claim 1, wherein said comparator means includes a two stage autozero comparator.

3. A comparator according to claim 1, including a reference signal generator connected to said second input of said differential sense amplifier and said reference signal generator having an output stage matched to the output stage of said comparator means.

4. A comparator according to claim 1, wherein said sense amplifier means includes matched input buffers at said first and second inputs of said differential sense amplifier.

5. A comparator according to claim 5 wherein said input buffers include:
two series connected transistors at said first input, one of which has a control electrode connected to said comparator means and another of which has a control electrode connected to said reference signal; and
two series connected transistors at said second input each having a control electrode connected to said reference signal.

6. A comparator according to claim 1, wherein said sense amplifier means includes first and second sense transistors connected respectively to said first and second inputs of said differential sense amplifier, and first and second cross-coupled regenerative active loads connected to said first and second sense transistors respectively.

7. A comparator according to claim 1, wherein said sense amplifier means includes output buffer means connecting said output of said differential sense amplifier to said input of said output means.

8. A comparator comprising:
comparator means, having first and second signal inputs and an output, for comparing signals at said first and second inputs and providing a signal at said output of said comparator means as function of said comparison;
sense amplifier means, having an input connected to said output of said comparator means and an output, for sensing signals at said input of said sense amplifier means and providing an amplified signal at said output of said sense amplifier means;
decoding means, having an input connected to said output of said sense amplifier means and an output, for decoding said amplified signal into data; and
latch means, having an input connected to said output of said decoding means and an output, for receiving data from said decoding means and latching said received data.

9. A comparator according to claim 8, wherein said latch includes a D-type master-slave flip-flop.

10. A comparator according to claim 8, including clock means for generating a clock signal to control said comparator means; and strobe means for generating a strobe signal which leads said clock signal with respect to phase and controls said sense amplifier means and said latch means.

11. A comparator comprising:
comparator means having first and second signal inputs and an output for comparing signals at said first and second inputs and providing a signal at said output of said comparator means as function of said comparison;
decoding means, having an input connected to said output of said comparator means and an output, for decoding said amplified signal into data; and
latch means, having an input connected to said output of said decoding means and an output, for receiving data from said decoding means and latching said received data.

12. A comparator according to claim 11, wherein said comparator means includes a two stage autozero comparator.

13. A comparator according to claim 11, wherein said latch means includes master-slave flip-flop.

14. A comparator according to claim 13, wherein said master-slave flip-flop is a pair of D-type latches.

15. A comparator according to claim 11, including clock means for generating a clock signal to control said comparator means; and
strobe means for generating a strobe signal which leads said clock signal with respect to phase and controls said latch means.

16. An analog-to-digital converter comprising:
input means for receiving an analog signal;
a plurality of parallel comparator means, each having a first input connected to said input means and a second input connected to a respective reference value, for providing a signal at said output of said comparator means as function of said comparison;
a plurality of sense amplifier means each including a differential sense amplifier, having a first input connected to said output of a respective comparator means and a second input connected to a reference signal and an output, for sensing signals at said first input of said differential sense amplifier and providing an amplified signal at said output of said sense amplifier; and
output means, having an input connected to said output of said plurality of sense amplifiers and an output, for receiving and decoding said amplified signal into a digital signal.

17. An analog-to-digital converter according to claim 16, wherein said comparator means each include a two stage autozero comparator.

18. An analog-to-digital converter according to claim 16, including one or more reference signal generators connected to said second input of a respective differential sense amplifier and each reference signal generator having an output stage matched to the output stage of said comparator means.

19. An analog-to-digital converter according to claim 16, wherein said each reference signal generator is connected to said second input of a respective group of differential sense amplifiers.

20. An analog-to-digital converter according to claim 16, wherein said sense amplifier means each includes matched input buffers at said first and second inputs of said differential sense amplifier.

21. An analog-to-digital converter according to claim 23 wherein said input buffers include:
two series connected transistors at said first input, one of which has a control electrode connected to said comparator means and another of which has a control electrode connected to said reference signal generator; and
two series connected transistors at said second input each having a control electrode connected to said reference signal generator.

22. An analog-to-digital converter according to claim 16, wherein said sense amplifier means each include first and second sense transistors connected respectively to said first and second inputs of said differential sense amplifier, and first and second cross-coupled regenerative active loads connected to said first and second sense transistors respectively.

23. An analog-to-digital converter according to claim 16, wherein said sense amplifier means each include output buffer means connecting said output of said differential sense amplifier to said input of said output means.

24. An analog-to-digital converter comprising:
input means for receiving an analog signal;
a plurality of parallel comparator means, each having a first input connected to said input means and a second input connected to a respective reference value, for providing a signal at said output of said comparator means as function of said comparison;
a plurality of sense amplifier means, having an input connected to said output of a respective comparator means and an output, for sensing signals at said input of said sense amplifier means and providing an amplified signal at said output of said sense amplifier means;
a plurality of decoding means, having an input connected to said output of a respective sense amplifier means and an output, for decoding said amplified signal into data; and
a plurality of latch means, having an input connected to said output of a respective decoding means and an output, for receiving data from said decoding means and latching said received data.

25. An analog-to-digital converter according to claim 24, wherein each of said latch means includes a D-type master-slave flip-flop.

26. An analog-to-digital converter according to claim 24, including clock means for generating a clock signal to control said comparator means; and strobe means for generating a strobe signal which leads said clock signal with respect to phase and controls said sense amplifier means and said latch means.

27. A comparator comprising:
comparator means, having first and second signal inputs and an output, for comparing signals at said first and second inputs and providing a signal at said output of said comparator means as function of said comparison;
sense amplifier means, having an input connected to said output of said comparator means and an output, for sensing signals at said input of said sense amplifier means and providing an amplified signal at said output of said sense amplifier means;
output means, having an input connected to said output of said sense amplifier means and an output, for receiving and latching said amplified signal;
clock means for generating a clock signal to control said comparator means; and
strobe means for generating a strobe signal which leads said clock signal with respect to phase and controls said second amplifier means.

28. An analog-to-digital converter comprising:
input means for receiving an analog signal;
a plurality of parallel comparator means, each having a first input connected to said input means and a second input connected to a respective reference value, for providing a signal at said output of said comparator means as function of said comparison;
a plurality of sense amplifier means, having an input connected to said output of a respective comparator means and an output, for sensing signals at said input of said sense amplifier means and providing an amplified signal at said output of said sense amplifier means;
output means, having an input connected to said output of said plurality of sense amplifier means and an output, for receiving and decoding said amplified signal into a digital signal;
clock means for generating a clock signal to control said comparator means; and
strobe means for generating a strobe signal which leads said clock signal with respect to phase and controls said sense amplifier means.

* * * * *